(12) United States Patent  (10) Patent No.: US 7,359,463 B2
Noda  (45) Date of Patent: Apr. 15, 2008

(54) CODE SENSING METHOD AND APPARATUS

(75) Inventor: Makoto Noda, Tokyo (JP)

(73) Assignee: Sony Corporation, Tokyo (JP)

( * ) Notice: Subject to any disclaimer, the term of this patent is extended or adjusted under 35 U.S.C. 154(b) by 743 days.

(21) Appl. No.: 10/433,509

(22) PCT Filed: Oct. 2, 2002

(86) PCT No.: PCT/JP02/10249

§ 371 (c)(1), (2), (4) Date: Jun. 3, 2003

(87) PCT Pub. No.: WO03/032314

PCT Pub. Date: Apr. 17, 2003

(65) Prior Publication Data

US 2004/0136467 A1    Jul. 15, 2004

(30) Foreign Application Priority Data

Oct. 4, 2001    (JP)    ............................ 2001-308113

(51) Int. Cl.
*H03D 1/00*    (2006.01)
*H04L 27/06*    (2006.01)
*H03M 13/03*    (2006.01)

(52) U.S. Cl. ...................... 375/341; 714/796

(58) Field of Classification Search ................ 375/262, 375/263, 265, 340, 341; 714/794, 795, 796
See application file for complete search history.

(56) References Cited

U.S. PATENT DOCUMENTS 5,809,071 A    9/1998 Kobayashi et al.

6,148,043 A *    11/2000 Fujimoto .................... 375/341

(Continued)

FOREIGN PATENT DOCUMENTS

EP    0 644 661    3/1995

(Continued)

OTHER PUBLICATIONS

Webster's II New Riverside University Dictionary, Hougton Mifflin Company, 1988, p. 307.*

(Continued)

*Primary Examiner*—Betsy L. Deppe
(74) *Attorney, Agent, or Firm*—Finnegan, Henderson, Farabow, Garrett & Dunner, L.L.P.

(57) ABSTRACT

The present invention establishes a metric calculation method. A constant calculation circuit 31 calculates constants V/2−A, V/2+A, and A/2, which are required to calculate branch metrics by using an average voltage V/2, corresponding to a parameter R input from an asymmetrical register, which is input from an average voltage register, and output them to adders 33, 35, and 36, respectively. A multiplier 32 multiplies an equalized signal $y_k$ by a value P of 1 or −1 input from a polarity register. A bit shifter 37 shifts by c bits A/2−$y_k$, corresponding to the parameter R input from the asymmetrical register, which is input from the adder 36. That is, the bit shifter 37 multiplies A/2−$y_k$ by α, and outputs it to adders 38 and 39. However, when the parameter R is 0, the bit shifter 37 outputs 0 to the adders 38 and 39. The present invention can be applied to a recording and reproduction apparatus.

11 Claims, 7 Drawing Sheets

U.S. PATENT DOCUMENTS 6,718,511 B2* 4/2004 Kravtchenko et al. ...... 714/796
2002/0114411 A1* 8/2002 Nakano et al. ............. 375/341

FOREIGN PATENT DOCUMENTS

| JP | 8-31101 | 2/1996 |
|---|---|---|
| JP | 8-45186 | 2/1996 |
| JP | 8-221904 | 8/1996 |

OTHER PUBLICATIONS

L. Fredrickson, "Trellis Coding in the Venus FRML Read/Write Channel," IEEE Transactions on Magnetics, vol. 33, No. 5, Sep. 1997.

* cited by examiner

FIG. 4

| R | α | C | A/2 | V/2−A | V/2+A |
|---|---|---|---|---|---|
| 00 | 0 | — | 0(00) | 8(1000) | 8(1000) |
| 01 | 0.0625(1/16) | 4 | 0(00) | 7(0111) | 9(1001) |
| 10 | 0.1250(1/8) | 3 | 1(01) | 6(0110) | 10(1010) |
| 11 | 0.2500(1/4) | 2 | 2(10) | 4(0100) | 12(1100) |

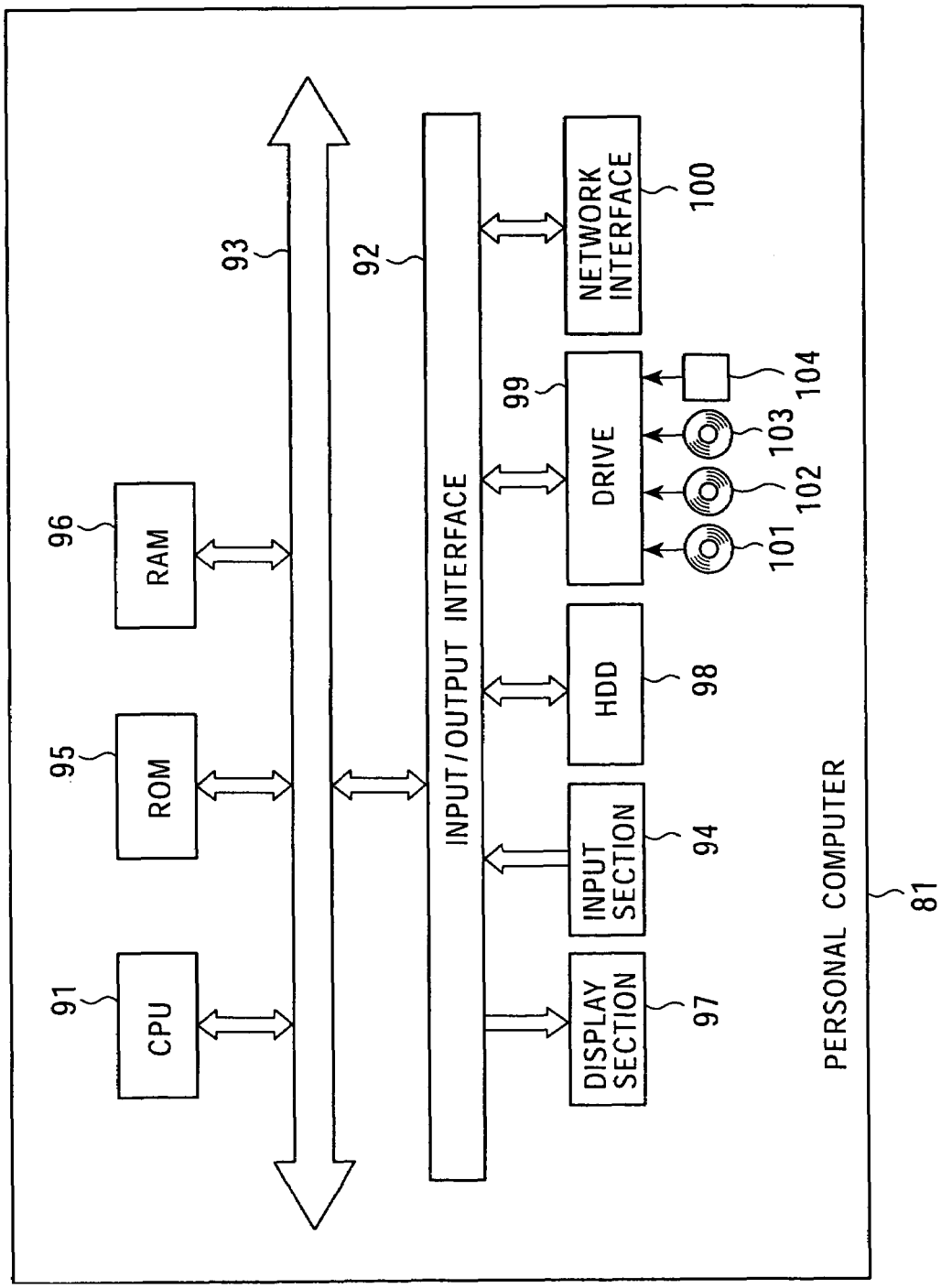

CODE SENSING METHOD AND APPARATUS

TECHNICAL FIELD

The present invention relates to code detection methods and apparatuses, for example, code detection methods and apparatuses suitable for use in a case in which an upper and lower asymmetry of a three-valued detection signal is compensated for in a code detection circuit incorporated in a magnetic recording and reproduction apparatus such as a digital video tape recorder and a hard disk drive for a computer, a magneto-optical recording and reproduction apparatus such as a magneto-optical disk drive, or various communication devices.

BACKGROUND ART

In general, various types of recording and reproduction apparatuses are designed to reduce the error rate of reproduced data by coding data to be recorded and recording the data. During the reproduction of the recording and reproduction apparatus, after a reproduced waveform read from a recording medium is equalized to a target equalized characteristic, this is converted into a digital equalized signal, and furthermore, after the signal is converted into coded data, it is decoded, thereby reconstructing the original data.

Similarly, also, in various communication devices, by coding data to be communicated and transmitting it, the error rate of received data is reduced. During the reception by the communication device, after the received waveform is equalized to a target equalized characteristic, it is converted into a digital equalized signal, and furthermore, the signal is converted into coded data, and then it is decoded, thereby reconstructing the original data.

For conversion from a digital equalized signal into coded data during the reproduction of the above-described recording and reproduction apparatus and the reception of the above-described communication device, a viterbi decoding technique, which is one of the maximum likelihood detection methods, is often used.

In an ordinary viterbi decoding technique, by denoting a reproduced signal containing noise at time k as $y_k$, an ideal signal with no noise in a state s on a Trellis diagram as $d_k(s)$, a logarithmic likelihood, that is, a metric $m_k(s)$, is calculated on the basis of the following equation (1):

$$m_k(s)=m_{k-1}(s')+\{y_k-d_k(s)\}^2 \qquad (1)$$

where s' is the state at the previous time k−1 of an input path on the Trellis diagram.

In the viterbi decoding technique, by selecting the path whose metric calculated using equation (1) in each state on the Trellis diagram is smaller, the detection of the maximum likelihood path is performed.

Alternatively, the detection of the maximum likelihood path may be performed in such a way that the branch metric in equation (1), that is, the second term $\{y_k-d_k(s)\}^2$ of the right side is subtracted from $m_{k-1}(s')$ and the path whose metric is greater is selected.

For the metric, eventually, only the magnitude relationship is important. Therefore, usually, the metric $m_k(s)$ is computed in such a way that a predetermined appropriate constant is subjected to the four basic operations of arithmetic: addition, subtraction, multiplication, and division in the right side of equation (1), and is normalized into as simple an equation as possible.

The normalization of equation (1) will now be described specifically. When equation (1) is expanded, the result is as shown in the following equation (2):

$$m_k(s)=m_{k-1}(s')+y_k^2-2y_kd_k(s)+d_k(s)^2 \qquad (2)$$

When $y_k^2$ is subtracted from equation (2) and the result is divided by 2, the following equation (3) is obtained:

$$m_k(s)=m_{k-1}(s')+d_k(s)\{d_k(s)/2-y_k\} \qquad (3)$$

However, although the value of the metric $m_k(s)$ of the left side of equation (3) differs from that of the metric $m_k(s)$ of the left side of equation (2), the same symbol is used as the normalized metric.

Next, a method of calculating the metric $m_k(s)$ by applying the normalized equation (3) will now be described by using as an example a case in which a three-valued detection is performed by using a partial response class 1 (PR1) equalizing method, a partial response class 4 (PR4) equalizing method, etc.

The partial response class 1 equalizing method is an equalizing method employed in 3.8-mm and 8-mm tape streamer magnetic recording and reproduction apparatus, etc., and is known to have a characteristic for suppressing noise in a high-frequency band of a reproduced signal. The partial response class 4 equalizing method is an equalizing method employed in a hard disk drive, a consumer-oriented digital VCR (Video Cassette Recorder), etc., and is known to have a characteristic for suppressing noise in two bands, a low-frequency band containing DC components of a reproduced signal and a high-frequency band.

When a three-valued detection is to be performed, a normalized detected voltage $d_k(s)$ is of three types of $\{-1, 0, +1\}$, but in practice, the reproduced signal is quantized. Therefore, if the absolute value of the average detected voltage is denoted as V, the normalized detected voltage $d_k(s)$ is represented as $\{-V, 0, +V\}$.

In this case, the branch metric $d_k(s)\{d_k(s)/2-y_k\}$ of equation (3) is limited to the following equations. (4-1) to (4-3).

In the case of $d_k(s)=+V$, $$V(V/2-y_k) \qquad (4-1)$$

In the case of $d_k(s)=0$, $$0 \qquad (4-2)$$

In the case of $d_k(s)=-V$ $$V(V/2+y_k) \qquad (4-3)$$

Furthermore, each of equations (4-1) to (4-3) is divided by V, and each branch metric is normalized as shown in the following equations (5-1) to (5-3).

In the case of $d_k(s)=+V$, $$V/2-y_k \qquad (5-1)$$

In the case of $d_k(s)=0$ $$0 \qquad (5-2)$$

In the case of $d_k(s)=-V$ $$V/2+y_k \qquad (5-3)$$

If the branch metric is calculated using the equations (5-1) to (5-3), the multiplier of the circuit for calculating the branch metric can be omitted when compared to a case in which the branch metric is calculated using the equations (5-1) to (5-3).

Next, a description will now be given of compensation in a case where a non-linear upper and lower asymmetry is observed in a reproduced waveform during the reproduction of the above-described recording and reproduction apparatus. Such non-linear upper and lower asymmetry of a reproduced waveform is caused by a magnetic configuration of a recording and reproduction head mounted in the recording and reproduction apparatus.

For example, in a case where there is an asymmetry of magnetic domains in the head core of an inductive reproduction head, or in a case where the magnetoresistance element of a magnetoresistance reproduction head has an inappropriate bias magnetic-field intensity, there are cases in which a conspicuous upper and lower asymmetry is observed in the reproduced waveform.

When an upper and lower asymmetry is observed in the reproduced waveform, unless some countermeasures are taken, the error correction rate during decoding is decreased. Therefore, usually, some kind of asymmetry correction is performed. Asymmetry correction can be performed when a recorded code is converted into a recording rectangular waveform during recording or when a reproduced waveform is equalized in an analog manner during reproduction.

On the other hand, a method is conceived in which non-linear components due to the upper and lower asymmetry of the reproduced waveform are compensated for when the digital equalized signal is converted into coded data during reproduction.

For example, when a three-valued detection is to be performed, if the absolute value of the negative detected voltage is denoted as U and the normalized detected voltage $d_k(s)$ is represented as $\{-U, 0, +V\}$, the branch metric $d_k(s)\{d_k(s)/2-y_k\}$ of equation (3) is limited to the following equations (6-1) to (6-3).

In the case of $d_k(s)=+V$, $$V(V/2-y_k) \tag{6-1}$$

In the case of $d_k(s)=0$ $$0 \tag{6-2}$$

In the case of $d_k(s)=-U$ $$U(U/2+y_k) \tag{6-3}$$

When the branch metrics are computed using the equations (6-1) to (6-3), a computation of multiplying V or U is required.

Furthermore, if equations (6-1) to (6-3) are normalized by being divided by V similarly to that in which equations (4-1) to (4-3) and equations (5-1) to (5-3) are normalized, the following equations (7-1) to (7-3) are obtained.

In the case of $d_k(s)=+V$, $$V/2-y_k \tag{7-1}$$

In the case of $d_k(s)=0$ $$0 \tag{7-2}$$

In the case of $d_k(s)=-U$ $$(U/V)(U/2+y_k) \tag{7-3}$$

However, even if the branch metrics are computed using the normalized equations (7-1) to (7-3), division and multiplication operations are necessary.

When division and multiplication operations are performed in the calculation of the metric, since a multiplier and a divider are necessary for the computation circuit, problems arise in that the circuit scale becomes larger and the computation time is increased correspondingly.

Therefore, in the non-linear compensation in the calculation of the metric, a method which does not require the above-described multiplication has been proposed.

For example, in L. Fredrickson, G. Betti, M. Marrow, G. Maguire and P. Gillen, "Trellis Coding in the Venus PRML Read/Write Channel," IEEE Trans. on Magn., vol. 33, no. 5, pp. 2743-2745, September 1997 (hereinafter referred to as "reference 1"), by approximating U/V to 1, a method of using the following equations (8-1) to (8-3) instead of equations (7-1) to (7-3) is described.

In the case of $d_k(s)=+V$, $$V/2-y_k \tag{8-1}$$

In the case of $d_k(s)=0$ $$0 \tag{8-2}$$

In the case of $d_k(s)=-U$ $$U/2+y_k \tag{8-3}$$

In the method described in reference 1, the absolute value U of the negative detected voltage in equation (8-3) is given by the register setting of the computation circuit.

According to the method described in reference 1, since there is no need to execute multiplication and division operations in the calculation of the metric, an increase in the scale of the computation circuit can be suppressed, and the computation time can be shortened.

However, in the method described in reference 1, since an approximation with U/V=1 is used in the calculation of the metric, there is a problem in that the accuracy of the calculation result is low.

Therefore, there has been a demand for the realization of a metric calculation method in which an approximation is not used and a multiplier is not used. However, conventionally, there is a problem in that such a method has not been invented.

DISCLOSURE OF INVENTION

The present invention has been made in view of such circumstances. An object of the present invention is to establish a metric calculation method which has an accuracy higher than that in which an approximation is used and which does not use a multiplier.

The code detection method of the present invention comprises a calculation step of calculating a branch metric by denoting a normalized upper and lower asymmetry of a reproduced signal $y_k$ as $\alpha$, by denoting the absolute value of an average detected voltage as V, and by setting an upper and lower asymmetrical voltage as $A=\alpha V$, thereby defining a three-valued detection-point voltage $d_k(s)$ as $\{-V+A, 0, V+A\}$.

In the process of the calculation step, when the detection-point voltage $d_k(s)$ is V+A, as the branch metric, $V/2+A-y_k+\alpha(A/2-y_k)$ may be calculated, when the detection-point voltage $d_k(s)$ is 0, the branch metric may be set to 0, and when the detection-point voltage $d_k(s)$ is $-V+A$, as the branch metric, $V/2-A+y_k+\alpha(A/2-y_k)$ may be calculated.

In the process of the calculation step, a natural number c, in which $2^c=1/|\alpha|$, may be defined, and the multiplication of $\alpha$ in the calculation of the branch metric may be realized by the bit shift of c bits.

In the process of the calculation step, when the normalized upper and lower asymmetry $\alpha$ is negative, after the polarity of the reproduced signal $y_k$ is inverted, the branch metric may be calculated.

The code detection method of the present invention may further comprise a computation step of computing the upper and lower asymmetrical voltage A by adding noise in a case where the absolute value V of the average detected voltage is not 0.

The code detection apparatus of the present invention comprises calculation means for calculating a branch metric by denoting a normalized upper and lower asymmetry of a reproduced signal $y_k$ as $\alpha$, by denoting the absolute value of an average detected voltage as V, and by setting an upper and lower asymmetrical voltage as $A=\alpha V$, thereby defining a three-valued detection-point voltage $d_k(s)$ as $\{-V+A, 0, V+A\}$.

A program on the recording medium of the present invention comprises a first calculation step of calculating $V/2+A-y_k+\alpha(A/2-y_k)$ as a branch metric when the detection-point voltage $d_k(s)$ is $V+A$; and a second calculation step of calculating $V/2-A+y_k+\alpha(A/2-y_k)$ as a branch metric when the detection-point voltage $d_k(s)$ is $-V+A$.

The program of the present invention comprises a first calculation step of calculating $V/2+A-y_k+\alpha(A/2-y_k)$ as a branch metric when the detection-point voltage $d_k(s)$ is $V+A$; and a second calculation step of calculating $V/2-A+y_k+\alpha(A/2-y_k)$ as a branch metric when the detection-point voltage $d_k(s)$ is $-V+A$.

In the code detection method and the code detection apparatus of the present invention, a branch metric is calculated by denoting a normalized upper and lower asymmetry of a reproduced signal $y_k$ as $\alpha$, by denoting the absolute value of an average detected voltage as V, and by setting an upper and lower asymmetrical voltage as $A=\alpha V$, thereby defining a three-valued detection-point voltage $d_k(s)$ as $\{-V+A, 0, V+A\}$.

In the recording medium and the program of the present invention, when the detection-point voltage $d_k(s)$ is $V+A$, as the branch metric, $V/2+A-y_k+\alpha(A/2-y_k)$ is calculated, and when the detection-point voltage $d_k(s)$ is $-V+A$, as the branch metric, $V/2-A+y_k+\alpha(A/2-y_k)$ is calculated.

BRIEF DESCRIPTION OF THE DRAWINGS

FIG. 4 shows the correspondence among a parameter R, the absolute value of a normalized upper and lower asymmetry $\alpha$, etc.

FIG. 7 is a block diagram showing the configuration of a personal computer.

BEST MODE FOR CARRYING OUT THE INVENTION

Figure 1:
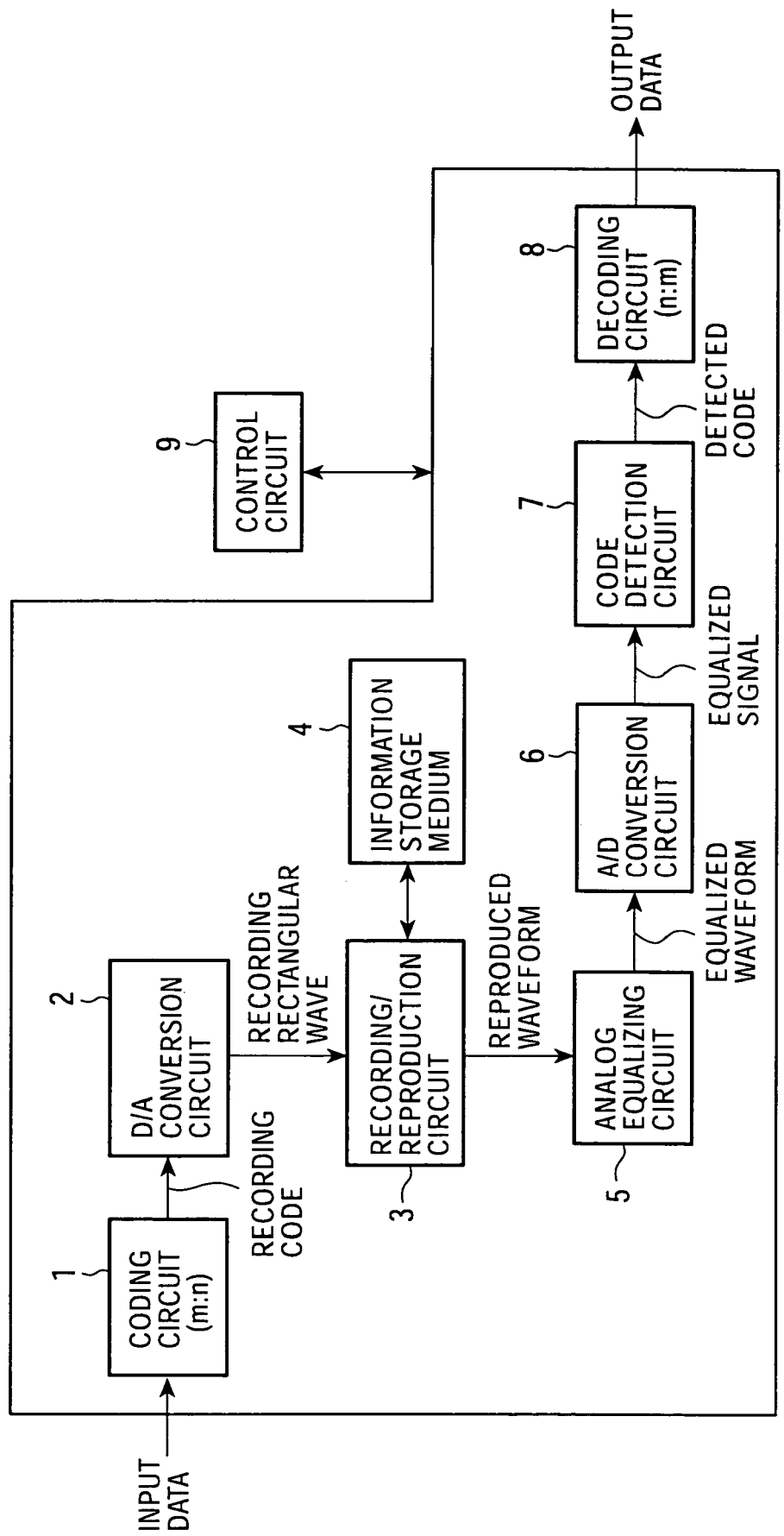
FIG. 1 is a block diagram showing an example of the configuration of a digital signal processing circuit of a recording and reproduction apparatus to which the present invention is applied.

A description will now be given below, with reference to FIG. 1, of an example of the configuration of a digital signal processing circuit in a recording and reproduction apparatus to which the present invention is applied.

A coding circuit 1 codes input data at a ratio of m:n, and outputs the obtained recording code to a D/A conversion circuit 2. Here, m indicates the length of data bits before being coded, and n indicates the length of data bits after being coded. Examples of data to be input to the coding circuit 1 include AV data encoded by an MPEG (Moving Picture Experts Group)-2 standard.

A D/A conversion circuit 2 converts an input digital recording code into an analog signal, that is, a recording rectangular waveform, and outputs it to a recording and reproduction circuit 3.

For example, the recording and reproduction circuit 3, formed of a magnetic head, an optical pickup, circuits for driving them, etc., records the input recording rectangular waveform input from the D/A conversion circuit 2 on an information recording medium 4. Furthermore, the recording and reproduction circuit 3 reproduces a signal recorded on the information recording medium 4, and outputs the obtained analog reproduced waveform to an analog equalizing circuit 5. The analog equalizing circuit 5 equalizes the reproduced waveform input from the recording and reproduction circuit 3 to a predetermined target equalizing characteristic, and outputs the obtained equalized waveform to an A/D conversion circuit 6.

The A/D conversion circuit 6 incorporating a PLL (Phase-Locked Loop) circuit (not shown) converts the analog equalized waveform input from the analog equalizing circuit 5 into a digital form, and outputs the obtained equalized signal to a code detection circuit 7. For the PLL circuit incorporated in the A/D conversion circuit 6, a hybrid digital PLL circuit for performing only phase error detection in the digital section may be used, or a full-digital PLL circuit for performing phase error detection and signal synchronization in the digital section may be used. If equalization cannot be performed sufficiently by the analog equalizing circuit 5, a digital equalizing section may be provided between the A/D conversion circuit 6 and the code detection circuit 7. In this case, a low-pass filter may be provided in place of the analog equalizing circuit 5.

The code detection circuit 7, which uses a viterbi decoding technique, which is one of the maximum likelihood detection methods, converts an equalized signal input from the A/D conversion circuit 6 into a code, that is, detects a code from the equalized signal, and outputs it to a decoding circuit 8. The decoding circuit 8 decodes the detected code input from the code detection circuit 7 at a ratio of n:m in order to generate output data.

A control circuit 9 controls each circuit of the coding circuit 1 to the decoding circuit 8 forming the digital signal processing circuit via a control line.

Figure 2:
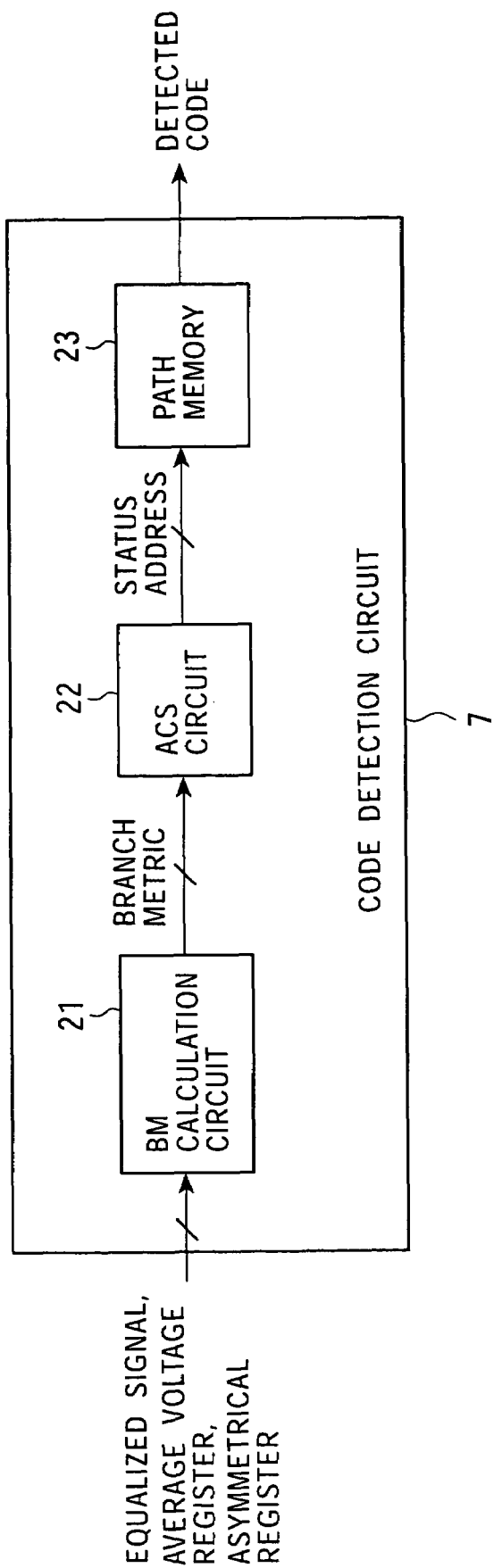
FIG. 2 is a block diagram showing an example of the configuration of a code detection circuit 7 of FIG. 1.

Next, referring to FIG. 2, an example of the configuration of the code detection circuit 7 will now be described. A branch-metric (BM) calculation circuit 21 calculates all the branch metrics to be used on the basis of the equalized signal input from the A/D conversion circuit 6, an average voltage V/2 input from an average voltage register, and a parameter R input from an asymmetrical register, and outputs them to an add, compare and select (ACS) circuit 22. The average voltage register and the asymmetrical register are incorporated in, for example, the control circuit 9.

The add, compare and select circuit 22 performs an ordinary ACS calculation by using the branch metrics input from the branch-metric calculation circuit 21, and outputs the status addresses in a number corresponding to the number of statuses indicating the survival path to a path memory 23. The path memory 23 selects the path specified by the status address input from the add, compare and select circuit 22, thereby inputting the detected code.

A method of calculating branch metrics by the branch-metric calculation circuit 21 will now be.described below. This calculation method is a method for compensating for the upper and lower asymmetry of the reproduced waveform in a case where, in particular, a three-valued detection is to be performed.

When the quantized upper and lower asymmetrical voltage of the reproduced waveform is defined as A and the quantized average three-valued detection-point voltage is defined as $\{-V+A, 0, V+A\}$, the branch metric $d_k(s)\{d_k(s)/2-y_k\}$ of equation (3) is limited to the following equations (9-1) to (9-3).

In the case of $d_k(s)=V+A$, $$(V+A)\{(V+A)/2-y_k\} \quad (9\text{-}1)$$

In the case of $d_k(s)=0$, $$0 \quad (9\text{-}2)$$

In the case of $d_k(s)=-V+A$, $$(-V+A)\{(-V+A)/2+y_k\} \quad (9\text{-}3)$$

If equations (9-1) to (9-3) are partially factorized, these can be simplified as in the following equations (10-1) to (10-3).

In the case of $d_k(s)=V+A$, $$V(V/2+A-y_k)+A(A/2-y_k) \quad (10\text{-}1)$$

In the case of $d_k(s)=0$, $$0 \quad (10\text{-}2)$$

In the case of $d_k(s)=-V+A$, $$V(V/2-A+y_k)+A(A/2-y_k) \quad (10\text{-}3)$$

If equations (10-1) to (10-3) are normalized by being divided by V, the following equations (11-1) to (11-3) are obtained.

In the case of $d_k(s)=V+A$, $$V/2+A-y_k+\alpha(A/2-y_k) \quad (11\text{-}1)$$

In the case of $d_k(s)=0$, $$0 \quad (11\text{-}2)$$

In the case of $d_k(s)=-V+A$, $$V/2-A+y_k+\alpha(A/2-y_k) \quad (11\text{-}3)$$

where $\alpha$ is the normalized upper and lower asymmetry, and $\alpha=A/V$.

In the branch-metric calculation circuit 21, branch metrics are computed using equations (11-1) to (11-3). Since the value of $\alpha$ observed actually is a relatively small value of less than 0.5, in the branch-metric calculation circuit 21, the multiplication of a is realized by the bit shift of c bits by setting the absolute value of $\alpha$ to $\frac{1}{2}^c$ (c is a natural number). In other words, the branch-metric calculation circuit 21 can be formed without requiring a multiplier for multiplying $\alpha$.

However, when the value of $\alpha$ is negative, the negative and positive polarities of the input equalized signal $y_k$ needs only to be inverted. Furthermore, in this case, since the code to be detected by the code detection circuit 7 is an NRZ (Non Return to Zero) code whose positive and negative polarities must be taken into consideration, it is also necessary to perform bit inversion on the detected code.

In the branch-metric calculation circuit 21, branch metrics may be computed by using the following equations (12-1) to (12-3) in which $\alpha(A/2-y_k)$ is subtracted from equations (11-1) to (11-3).

In the case of $d_k(s)=V+A$, $$V/2+A-y_k \quad (12\text{-}1)$$

In the case of $d_k(s)=0$, $$\alpha(y_k+A/2) \quad (12\text{-}2)$$

In the case of $d_k(s)=-V+A$, $$V/2-A+y_k \quad (12\text{-}3)$$

In the branch-metric calculation circuit 21, when branch metrics are computed by using equations (12-1) to (12-3), the total computation time can be shortened by the amount of time corresponding to that required for a process to add $\alpha(A/2-y_k)$ in comparison with a case in which branch metrics are computed by using equations (11-1) to (11-3). However, in this case, a larger number of adders are required in the add, compare and select circuit 22 at the subsequent stage of the branch-metric calculation circuit 21. That is, the circuit scale of the add, compare and select circuit 22 becomes larger.

A description will now be given below, with reference to FIG. 3, of an example of the configuration of the branch-metric calculation circuit 21 for computing branch metrics by using equations (11-1) to (11-3).

The constant calculation circuit 31 calculates constants V/2−A, V/2+A, and A/2, which are required to calculate the branch metrics shown in equations (11-1) to (11-3) by using the average voltage V/2, corresponding to the parameter R input from the asymmetrical register, which is input from the average voltage register, and outputs them to adders 33, 35, and 36, respectively. The correspondence between the parameter R and the normalized upper and lower asymmetrical voltage A of a reproduced waveform will be described later with reference to FIG. 4.

The multiplier 32 multiplies the equalized signal $y_k$ input from the A/D conversion circuit 6 at the upper stage by the value P of 1 or −1, input from a polarity register, and outputs it to the adder 33 and the multiplier 34. Here, the polarity register is incorporated in, for example, the control circuit 9. When the value of the normalized upper and lower asymmetry $\alpha$ is positive, the value P of the polarity register is set to 1. Conversely, when the value of the normalized upper and lower asymmetry $\alpha$ is negative, the value P of the polarity register is set to −1.

The adder 33 adds V/2−A, input from the constant calculation circuit 31, to the equalized signal $y_k$ to which a positive or negative polarity is given by the multiplier 32, and outputs it to the adder 39. The multiplier 34 multiplies the equalized signal $y_k$ to which a positive or negative polarity is given by the multiplier 32 by −1, and outputs it to the adders 35 and 36. The adder 35 subtracts the equalized signal $y_k$ from V/2+A, input from the donstant calculation circuit 31, and outputs it to the adder 38. The adder 36 subtracts the equalized signal $y_k$ from A/2, input from the constant calculation circuit 31, and outputs it to the bit shifter 37.

The bit shifter 37 shifts by c bits $A/2-y_k$, corresponding to the parameter R input from the asymmetrical register, which is input from the adder 36, in other words, divides $A/2-y_k$ by $2^c$. That is, the bit shifter 37 multiplies $A/2-y_k$ by $\alpha$, and outputs it to the adders 38 and 39. However, when the parameter R is 0, the bit shifter 37 outputs 0 to the adders 38 and 39. The correspondence among the parameter R, $\alpha$, and c will be described later with reference to FIG. 4.

The adder 38 adds the output $V/2+A-y_k$ of the adder 35 to the output $\alpha(A/2-y_k)$ of the bit shifter 37, and outputs the branch metric $V/2+A-y_k+\alpha(A/2-y_k)$ in the case of $d_k(s)=V+A$ shown in equation (11-1). The adder 39 adds the output $V/2-A+y_k$ of the adder 33 to the output $\alpha(A/2-y_k)$ of the bit shifter 37, and outputs the branch metric $V/2-A+y_k+\alpha(A/2-y_k)$ in the case of $d_k(s)=-V+A$ shown in equation (11-3).

Since the branch metric in the case of $d_k(s)=0$ shown in equation (11-2) is 0, the calculation is not necessary.

In a case where the branch-metric calculation circuit 21 is incorporated in the recording and reproduction apparatus, the number of quantized bits of the equalized signal $y_k$ is often approximately 6. If it is assumed that the number of quantized bits of the equalized signal $y_k$ is 6, the value of the equalized signal $y_k$ is expressed in a range of −32 to +31. In this case, the value of the absolute value V of the average detected voltage is approximately 16 to 24.

FIG. 4 shows examples of the absolute value c of the normalized upper and lower asymmetry α, and the values of the constants A/2, V/2−A, and V/2+A, output by the constant calculation circuit 31, in a case where the parameter R held in the asymmetrical register is 2 bits long and the absolute value V of the average detected voltage is 16.

When the parameter R is 00, the absolute value of α is 0, and A/2=0. When the parameter R is 01, the absolute value of α is $0.0625 = \frac{1}{16} = \frac{1}{2}_c$, the value c is 4, and A/2=0. When the parameter R is 10, the absolute value of α is $0.125 = \frac{1}{8} = \frac{1}{2}^c$, the value c is 3, and A/2=1. When the parameter R is 11, the absolute value of α is $0.25 = \frac{1}{4} = \frac{1}{2}^c$, the value c is 2, and A/2=2.

It is clear that the constant calculation circuit 31, shown in FIG. 4, for calculating a constant has a considerably simple configuration of about several gates.

Figure 5:
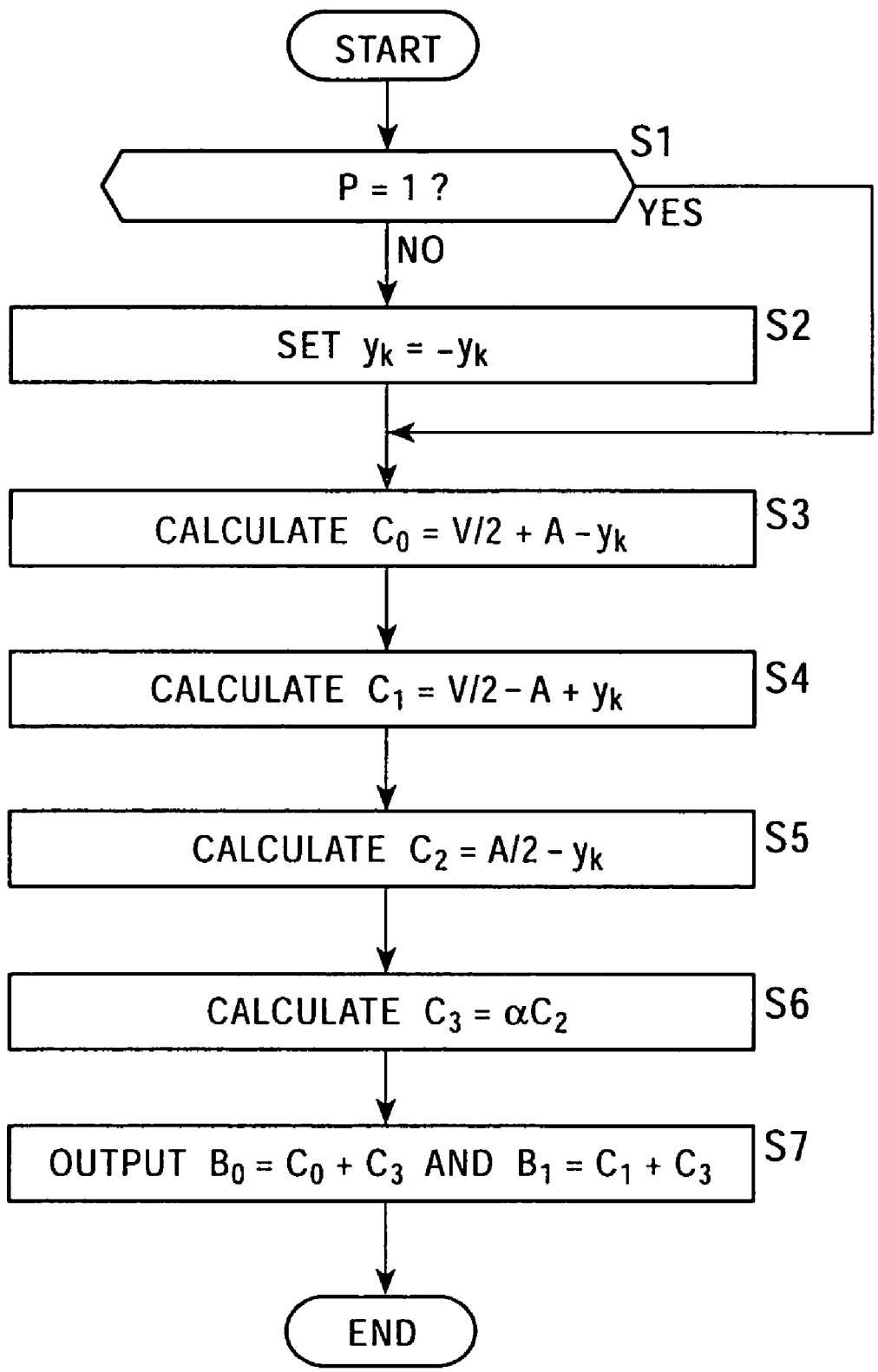
FIG. 5 is a flowchart illustrating a branch-metric calculation process.

A description will now be given below of a branch-metric calculation process with reference to the flowchart in FIG. 5.

The multiplier 32 multiplies the equalized signal $y_k$ input from the A/D conversion circuit 6 at the upper stage by the value P of 1 or −1, input from the polarity register. In other words, in step S1, the multiplier 32 determines whether or not the value P input from the polarity register is 1. When the value P is not 1, in step S2, the multiplier 32 multiplies the equalized signal $y_k$ by −1 so that $y_k = -y_k$, and outputs it to the adders 33 and the multiplier 34. When the value P is 1, the multiplier 32 outputs the equalized signal $y_k$ to the adder 33 and the multiplier 34.

In step S3, the multiplier 34 multiplies the equalized signal $y_k$ to which a positive or negative polarity is given by the multiplier 32 by −1, and outputs it to the adders 35 and 36. The adder 35 subtracts the equalized signal $y_k$ from v/2+A, input from the constant calculation circuit 31, in order to compute the value $C_0 = V/2 + A - y_k$, and outputs the value to the adder 38.

In step S4, the adder 33 adds v/2−A, input from the constant calculation circuit 31, to the equalized signal $y_k$ to which a positive or negative polarity is given by the multiplier 32 in order to compute the value $C_1 = V/2 - A + y_k$, and outputs the value $C_1$ to the adder 39.

In step S5, the adder 36 subtracts the equalized signal $y_k$ from A/2, input from the constant calculation circuit 31, in order to compute the value $C_2 = A/2 - y_k$, and outputs the value $C_2$ to the bit shifter 37.

In step S6, the bit shifter 37 multiplies the value $C_2 = A/2 - y_k$, computed in step S5, by α in order to compute $C_3 = \alpha C_2$, and outputs the value $C_3$ to the adders 38 and 39. However, when the parameter R is 0, the bit shifter 37 outputs the value 0 to the adders 38 and 39.

In step S7, the adder 38 adds together the output V/2+A−$y_k$ of the adder 35 and the output α(A/2−$y_k$) of the bit shifter 37, and outputs the branch metric $B_0 = C_0 + C_3 = V/2 + A - y_k + \alpha(A/2 - y_k)$ in the case of $d_k(s) = V + A$, shown in equation (11-1). The adder 39 adds together the output V/2−A+$y_k$ of the adder 33 and the output α(A/2−$y_k$) of the bit shifter 37, and outputs the branch metric $B_1 = C_1 + C_3 = V/2 - A + y_k + \alpha(A/2 - y_k)$ in the case of $d_k(s) = -V + A$, shown in equation (11-3). This completes the processing.

Next, a description will now be given of the results of simulation performed to compare the performances between the branch-metric calculation circuit 21 shown in FIG. 3 and the branch-metric calculation circuit, shown in FIG. 6, for calculating branch metrics on the basis of equations (8-1) to (8-3).

Figure 6:
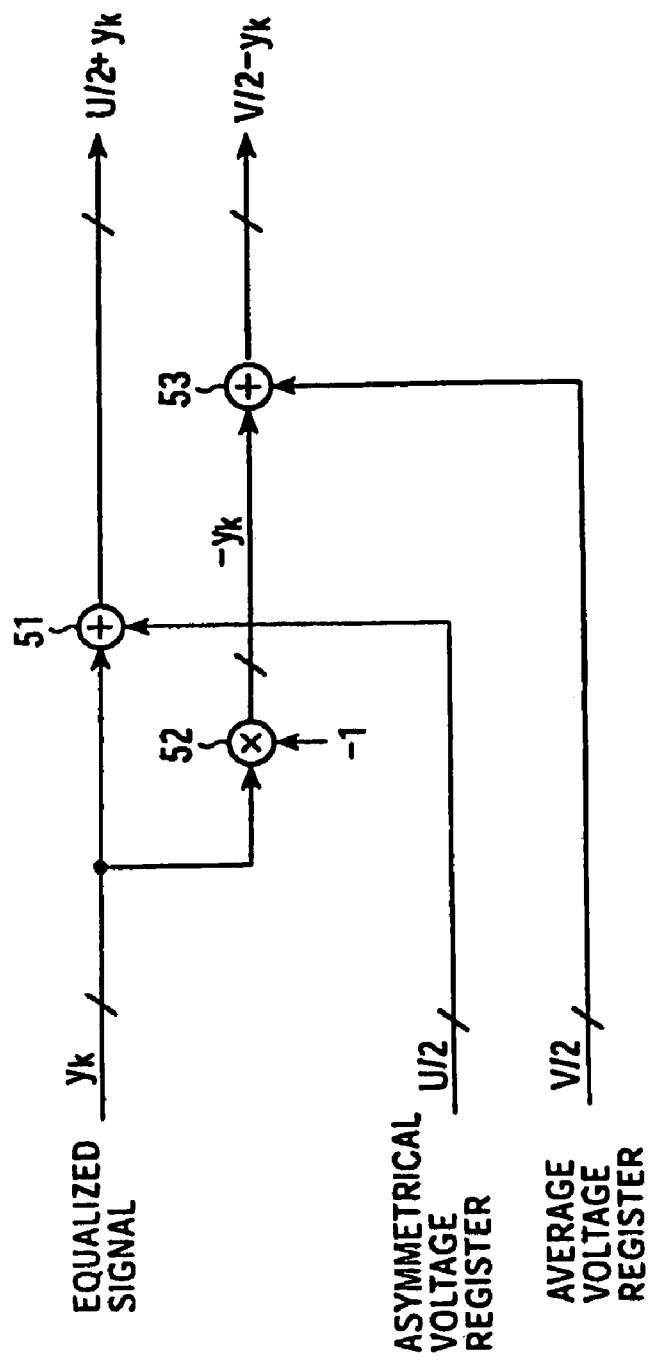
FIG. 6 is a block diagram showing an example of the configuration of a conventional branch-metric calculation circuit.

In the branch-metric calculation circuit of FIG. 6, an adder 51 adds U/2 to the equalized signal $y_k$, and outputs the branch metric shown in equation (8-3). A multiplier 52 multiplies the equalized signal $y_k$ by −1, and outputs it to an adder 53. The adder 53 adds, from V/2, the equalized signal $y_k$, which is multiplied by −1 by the multiplier 52, and outputs the branch metric shown in equation (8-1).

The simulation was performed as follows. Random data of one million bits was coded using a very ordinary 16/17 conversion code, this was subjected to interleaved NRZI modulation corresponding to a $1/(1-D^2)$ process, after which a partial response class 4 equalizing process of $(1-D^2)$ was performed. Furthermore, by varying the reproduced amplitude when the ideal detection-point signal is +1 and the reproduced amplitude when the ideal detection-point signal is −1, a pseudo-waveform asymmetry was given, after which appropriate white noise was added, thereby forming an equalized signal $y_k$.

Figure 3:
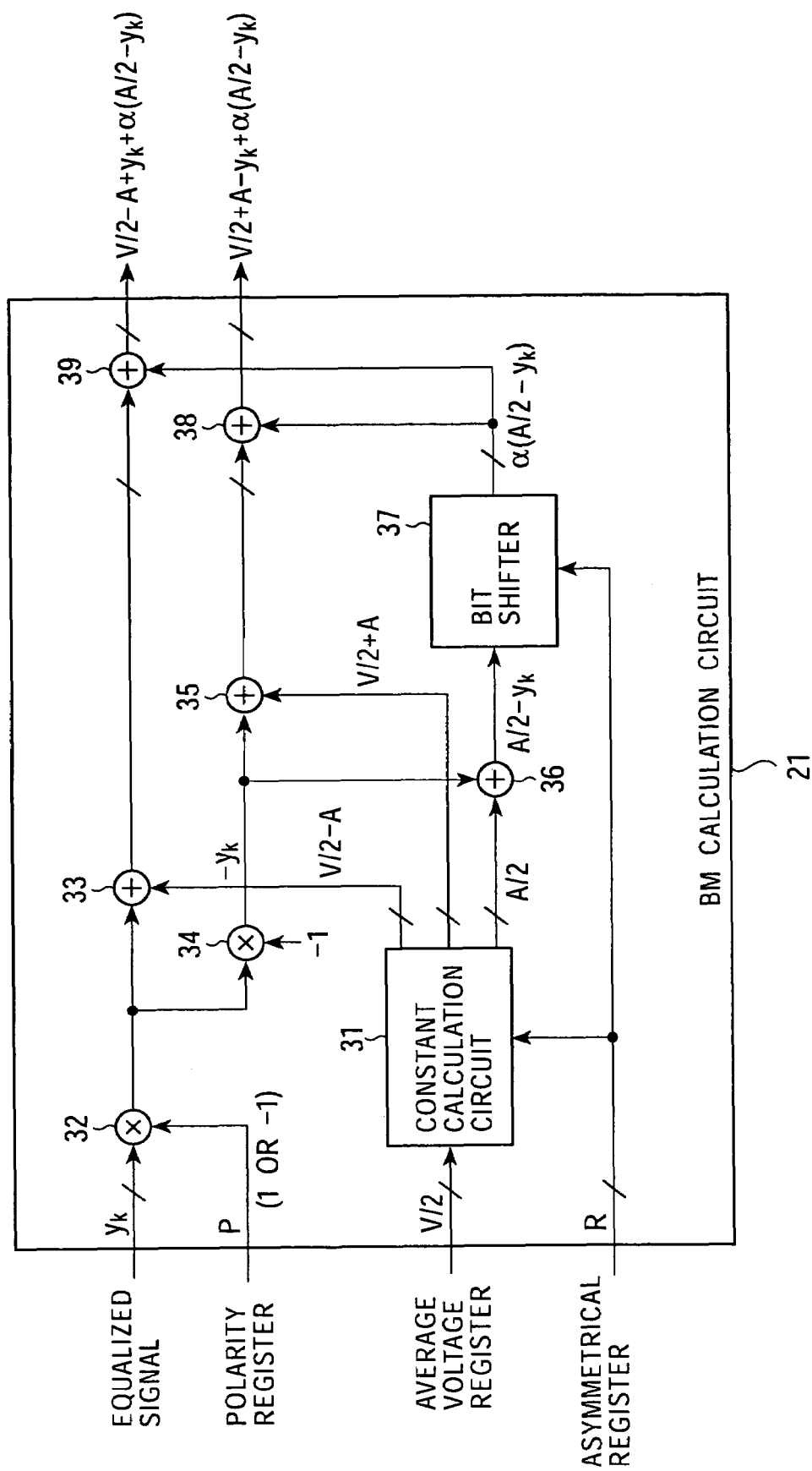
FIG. 3 is a block diagram showing an example of the configuration of a branch-metric calculation circuit 21 of FIG. 2.

For example, when the waveform asymmetry α=0.125, in a case where code detection was performed by the branch-metric calculation circuit 21 shown in FIG. 3, there was a gain of approximately 0.6 dB at the signal-to-noise ratio at which a bit error rate of $1 \times 10^{-5}$ was given when compared to a case in which the asymmetry correction was not performed in that circuit.

On the other hand, when, for example, the waveform asymmetrical voltage U was set as V(1−0.125)/(1+0.125) =0.778V so that the condition was made the same as the condition of the waveform asymmetry α=0.125, in a case where code detection was performed by the branch-metric calculation circuit of FIG. 6, there was a gain of approximately 0.3 dB at the signal-to-noise ratio at which a bit error rate of $1 \times 10^{-5}$ was given when compared to a case in which the asymmetry correction was not performed in that circuit.

In the manner described above, the branch-metric calculation circuit 21 to which the present invention is applied becomes capable of performing a more accurate waveform asymmetrical correction in comparison with the branch-metric calculation circuit shown in FIG. 6 in spite of a very slight increase of the circuit scale.

It is clear that a method of calculating a branch metric which is normalized by adding/subtracting a constant is included in the present invention.

In the constant calculation circuit 31 of the branch-metric calculation circuit 21, although the normalized asymmetrical voltage A is set in such a manner as to correspond to the parameter R, the waveform asymmetrical voltage A can be adaptively computed from actually measured data.

A description will now be given specifically. If an asymmetrical detected voltage {−V, 0, +V} with no noise at time k is denoted as $d_k$, an error signal $e_k$ is generally defined as follows:

$$e_k = y_k - d_k \qquad (13)$$

When the detected voltage is V or −V, by simply calculating the average value of the error signal $e_k$, it is possible to determine the waveform asymmetrical voltage A. In other words, by adding noise except for the case in which the detected voltage is 0, it is possible to compute the waveform asymmetrical voltage A.

In the manner described above, if the waveform asymmetrical voltage A determined on the basis of actually measured values is supplied to the constant calculation circuit 31, asymmetry correction with higher accuracy is made possible.

As has thus been described, in the recording and reproduction apparatus to which the present invention is applied, since asymmetry correction with higher accuracy than in a conventional case can be performed, it is possible to increase the recording density for an information recording medium to more than in a conventional case. This industrial value is highly regarded.

The present invention can be applied to a recording and reproduction apparatus in which a TCPR (Trellis Coded Partial Response) modulation method is employed.

For the code detection method of the present invention, for example, a Trellis code detection method can be used.

In the present invention, not only a most likelihood detection method, but also a posteriori probability detection method can be used.

Any kind of codes may be used in the present invention. For example, codes by a coding method using Trellis codes may be used.

The present invention can be applied to not only a recording and reproduction apparatus, but also to a communication device for communicating data.

The above-described series of processes can also be performed by software. For the software, programs forming the software are installed from a recording medium into a computer incorporated in dedicated hardware or into, for example, a general-purpose personal computer capable of executing various types of functions by installing various programs.

This recording medium is formed of a packaged medium composed of a magnetic disk 101, an optical disk 102, a magneto-optical disk 103, or a semiconductor memory 104, in which a program is recorded, which is distributed for providing the program to a user separately from a computer, as shown in FIG. 7. The magnetic disk 101 includes a flexible disk, the optical disk 102 includes a CD-ROM (Compact Disk-Read Only Memory) and a DVD (Digital Versatile Disk), and the magneto-optical disk 103 includes an MD (Mini-Disc) (trademark).

Referring to FIG. 7, a personal computer 81 will now be described below.

A CPU (Central Processing Unit) 91 receives inputs of signals corresponding to various constructions which are input by a user using an input section 94 via an input/output interface 92 and an internal bus 93, and a control signal transmitted by another computer via a network interface 100, and performs various processes on the basis of the input signals. A ROM (Read Only Memory) 95 stores programs and basically fixed data among parameters for computations, which are used by the CPU 91. A RAM (Random Access Memory) 96 stores programs used during the execution of the CPU 91, and parameters which appropriately change during the execution. The CPU 91, the ROM 95, and the RAM 96 are interconnected to each other by the internal bus 93.

The internal bus 93 is also connected to the input/output interface 92. The input section 94 is formed of, for example, a keyboard, a touch pad, a jog dial, a mouse, etc., and is operated when the user inputs various instructions to the CPU 91. A display section 97 is formed of, for example, a CRT (Cathode Ray Tube), a liquid-crystal display device, or the like, and displays various types of information in the form of text or images.

An HDD (hard disk drive) 98 drives a hard disk in order to cause it to record or reproduce a program executed by the CPU 91, and information. The magnetic disk 101, the optical disk 102, the magneto-optical disk 103, or the semiconductor memory 104 is loaded into the drive 99 as necessary, so that data is exchanged.

The network interface 100 is connected to other personal computers and various devices other than the personal computers by wire using a predetermined cable or in a wireless manner, so that information is exchanged with those devices, and an access to a Web server is made via the Internet so as to exchange information.

The sections from the input section 94 to the network interface 100 are connected to the CPU 91 via the input/output interface 92 and the internal bus 93.

In this specification, the steps by which a program to be recorded on a recording medium is written may be executed chronologically according to the written sequence. However, they do not have to be executed chronologically, and they may be executed concurrently or individually.

INDUSTRIAL APPLICABILITY

As described in the foregoing, according to the present invention, branch metrics can be calculated. In particular, since branch metrics are calculated by defining a three-value detection-point voltage $d_k(s)$ as $\{-V+A, 0, V+A\}$, a metric calculation method which has an accuracy higher than that in which an approximation is used and which does not use a multiplier can be established.

The invention claimed is:

1. A code detection method for calculating a branch metric using a normalized upper and lower asymmetry of a reproduced signal $y_k$ as $\alpha$, an absolute value of an average detected voltage as V, and an upper and lower asymmetrical voltage set as $A=\alpha V$ to define a three-valued detection-point voltage $d_k(s)$ as $\{(-V+A), 0, (V+A)\}$, the method comprising:

comparing the three-valued detection point voltage $d_k(s)$ and (V+A) or (−V+A);

calculating $V/2+A-y_k+\alpha(A/2-y_k)$ as the branch metric when $d_k(s)$ equals (V+A);

setting the branch metric equal to zero when $d_k(s)$ equals zero; and calculating $V/2-A+y_k+\alpha(A/2-y_k)$ as the branch metric when $d_k(s)$ equals (−V+A).

2. A code detection method according to claim 1, wherein, a natural number c, in which $2^c=1/|\alpha|$, is defined, and multiplication of $\alpha$ in the calculation of said branch metric is realized by a bit shift of c bits.

3. A code detection method according to claim 1, wherein the branch metric is calculated using an inverted $y_k$ when said normalized upper and lower asymmetry $\alpha$ is negative.

4. A code detection method according to claim 1, further comprising a computing step of computing said upper and lower asymmetrical voltage A by adding noise in a case where said absolute value V of the average detected voltage is not 0.

5. A code detection apparatus for calculating a branch metric using a normalized upper and lower asymmetry of a reproduced signal $y_k$ as $\alpha$, an absolute value of an average detected voltage as V, and an upper and lower asymmetrical voltage set as $A=\alpha V$ to define a three-valued detection-point voltage $d_k(s)$ as $\{(-V+A), 0, (V+A)\}$, the apparatus comprising:

a processor, wherein the processor:

compares the three-valued detection point voltage $d_k(s)$ to (V+A) or (−V+A);

calculates $V/2+A-y_k+\alpha(A/2-y_k)$ as the branch metric when $d_k(s)$ equals $(V+A)$;

sets the branch metric equal to zero when $d_k(s)$ equals zero; and calculates $V/2-A+y_k+\alpha(A/2-y_k)$ as the branch metric when $d_k(s)$ equals $(-V+A)$.

6. A recording medium having recorded thereon a computer-readable program for detecting codes by denoting a normalized upper and lower asymmetry of a reproduced signal $y_k$ as $\alpha$, by denoting the absolute value of an average detected voltage as V, and by setting an upper and lower asymmetrical voltage as $A=\alpha V$, thereby defining a three-valued detection-point voltage $d_k(s)$ as $\{(-V+A), 0, (V+A)\}$, said program causing a processor to execute the steps of:

calculating $V/2+A-y_k\alpha(A/2-y_k)$ as a branch metric when said detection-point voltage $d_k(s)$ is $(V+A)$;

calculating $V/2-A+y_k+\alpha(A/2-y_k)$ as a branch metric when said detection-point voltage $d_k(s)$ is $(-V+A)$; and using the branch metric to detect codes.

7. A method of calculating a branch metric within a code detection apparatus, the method comprising the steps of:

defining a normalized upper and lower asymmetry of a reproduced signal $y_k$ as $\alpha$;

defining the absolute value of an average detected voltage as V;

setting an upper and lower asymmetrical voltage as $A=\alpha V$;

calculating a three-valued detection-point voltage $d_k(s)$ as $\{(-V+A), 0, (V+A)\}$;

using $\alpha$, V, A, and $d_k(s)$ to calculate a branch metric; and using the branch metric to detect codes.

8. A method according to claim 7, wherein calculating the branch metric comprises:

calculating said branch metric as $V/2+A-y_k+\alpha(A/2-y_k)$ when the detection-point voltage $d_k(s)$ is $(V+A)$;

setting said branch metric to 0 when said detection-point voltage $d_k(s)$ is 0; and calculating said branch metric as $V/2-A+y_k+\alpha(A/2-y_k)$ when said detection-point voltage $d_k(s)$ is $(-V+A)$.

9. A method according to claim 7, wherein calculating the branch metric comprises:

defining a natural number c in which $2^c=1/|\alpha|$; and shifting c bits to multiply $\alpha$.

10. A method according to claim 7, wherein calculating said branch metric comprises using an inverted $y_k$ when said normalized upper and lower asymmetry $\alpha$ is negative.

11. A method according to claim 7, wherein calculating the branch metric comprises computing said upper and lower asymmetrical voltage A by adding noise when said absolute value V of the average detected voltage is not 0.

* * * * *